United States Patent [19]

Richardson

[11] Patent Number: 5,135,879
[45] Date of Patent: Aug. 4, 1992

[54] METHOD OF FABRICATING A HIGH DENSITY EPROM CELL ON A TRENCH WALL

[75] Inventor: William F. Richardson, Richardson, Tex.

[73] Assignee: Texas Instruments Incorporated, Dallas, Tex.

[21] Appl. No.: 702,977

[22] Filed: May 20, 1991

Related U.S. Application Data

[60] Division of Ser. No. 471,019, Jan. 19, 1990, Pat. No. 5,017,977, which is a continuation of Ser. No. 294,980, Jan. 3, 1989, abandoned, which is a continuation of Ser. No. 904,846, Sep. 5, 1986, abandoned, which is a continuation of Ser. No. 716,298, Mar. 26, 1985, abandoned.

[51] Int. Cl.⁵ .................................. H01L 21/304
[52] U.S. Cl. ........................................ 437/43; 437/63; 148/DIG. 50; 148/DIG. 168
[58] Field of Search ............ 437/43, 49, 52, 63, 437/64, 66, 67, 68, 79; 148/DIG. 50, DIG. 168; 357/23.5

[56] References Cited

U.S. PATENT DOCUMENTS

| | | |
|---|---|---|
| 4,163,988 | 8/1979 | Yeh et al. ............... 357/55 |
| 4,169,291 | 9/1979 | Rossler ................ 357/23.5 |
| 4,194,283 | 3/1980 | Hoffman ................. 437/68 |
| 4,206,005 | 6/1980 | Yeh ....................... 437/68 |
| 4,222,062 | 9/1980 | Trotter et al. ........ 148/DIG. 168 |
| 4,326,332 | 4/1982 | Kenney ................... 437/52 |
| 4,353,082 | 10/1982 | Chatterjee ............. 357/55 |
| 4,364,074 | 12/1982 | Garnache et al. ...... 357/23.5 |
| 4,493,740 | 1/1985 | Komeda ................. 437/63 |
| 4,542,396 | 9/1985 | Schutten et al. ...... 357/23.5 |

OTHER PUBLICATIONS

Kenney, "Self-Aligned U-Groove Gates for Field-Effect Transistors", IBM TBB, vol. 22, No. 10, pp. 4448-4449, Mar. 1980.

Primary Examiner—Brian E. Hearn
Assistant Examiner—C. Chaudhari
Attorney, Agent, or Firm—W. James Brady, III; Lawrence J. Bassuk; Richard L. Donaldson

[57] ABSTRACT

One embodiment of the present invention provides an EPROM array having floating gate field effect transistors formed on the sidewalls of trenches formed in a semiconducting substrate. Simultaneous with the fabrication of these trench wall transistors, column lines are formed between the trenches to the top surface and in the bottom of the trenches which extend from one end to the other of the memory array.

8 Claims, 3 Drawing Sheets

METHOD OF FABRICATING A HIGH DENSITY EPROM CELL ON A TRENCH WALL

This application is a division of U.S. patent application Ser. No. 07/471,019, now U.S. Pat. No. 5,017,977 filed Jan. 19, 1990, which is a continuation of U.S. patent application Ser. No. 07/294,980, filed Jan. 3, 1989, now abandoned, which is a continuation of U.S. patent application Ser. No. 06/904,846, filed Sep. 5, 1986, now abandoned, which is a continuation of U.S. patent application Ser No. 06/716,298, filed Mar. 26, 1985, now abandoned.

FIELD OF THE INVENTION

This invention relates to the field of integrated circuit fabrication. More specifically, this invention relates to the field of electrically programmable read only memory (EPROM) fabrication.

BACKGROUND OF THE INVENTION

One goal on the fabrication of integrated circuitry is to produce a circuit having maximum circuit density. This goal extends to the fabrication of EPROMs. An EPROM is a read only memory device in which the stored data may be erased and new data written in its stead. A widely used type of EPROM is the floating gate field effect transistor type. See Sze, Physics of Semiconductor Devices, Section 8.61 (1981). A partial schematic diagram of an EPROM using floating gate field effect transistors is shown in FIG. 1. Memory cells 26-1-1 through 26-2-4 are floating gate field effect transistors. Row decoder 28 provides output signals on row lines 24-1 and 24-2 in response to signals provided on row address input leads 21 and from read/write indicator 23. Column decoder 29 provides and receives signals on column lines 25-1 through 25-5 in response to signals provided on column address input leads 22 and from read/write indicator 23. A memory output signal is provided on output lead 27. A data bit stored in, for example, memory cell 26-1-1 is read by providing a high voltage output signal on row line 24-1 and providing a low voltage output signal on all other row lines.

Column decoder 29 then senses, via column lines 25-1 and 25-2, the impedance of memory cell 26-1-1. If the floating gate memory of memory cell 26-1-1 contains excess electrons, the negative charge of these excess electrons raises the threshold voltage of memory cell 26-1-1 so that the voltage provided on row line 24-1 is insufficient to cause the channel of memory cell 26-1-1 to conduct. Therefore, column decoder 29 detects a high impedance and provides an appropriate signal on output lead 27. If there are no excess electrons stored on the floating gate on memory cell 26-1-1, then the voltage supplied on row line 24-1 is sufficient to cause memory cell 26-1-1 to conduct. Therefore, column decoder 29 detects a low impedance and provides the appropriate signal on output lead 27.

EPROM 20 is thus programmed by negatively charging the floating gate of selected memory cells. This is accomplished by injecting hot electrons through the insulating layer between the floating gate and the substrate of the memory cell.

Prior art methods of forming floating gate field effect transistors produced field effect transistors having a channel region horizontally disposed in a substrate, an insulator horizontally disposed above the channel, a floating gate horizontally disposed above the insulator, and a control gate insulated from and horizontally disposed above the floating gate

SUMMARY OF THE INVENTION

One embodiment of the present invention provides a structure having floating gate field effect transistors formed on the sidewalls of trenches formed in a semiconducting substrate. Simultaneous with the fabrication of these trench wall transistors, column lines are formed in the bottom of the trenches and on the top surface between the trenches; these column lines extend the from one end to the other of the memory array.

First, a heavily doped layer, covering the area of the array, is formed in the surface of a semiconductor substrate. A thick oxide layer is then deposited above the heavily doped layer. Trenches are then patterned and etched through the oxide, the heavily doped layer and deep into the substrate using an anisotropic etching process. This etching step forms the portion of the trench which defines the channel length of the floating gate field effect transistors as well a the width of the column lines. Silicon dioxide is then deposited on the exposed surfaces of the trenches thus formed. The silicon substrate is once again anisotropically etched using a two step process which first removes the oxide in the bottom of the trenches and then anisotropically etches the silicon to form the portion of the trench which defines the cross- sectional area of the buried column lines of the EPROM.

The trenches are then filled with doped polycrystalline semiconductor material. The doping of this semiconductor material diffuses into the silicon substrate during subsequent processing steps. This diffusion forms the drain of the floating gate field effect transistors. The polycrystalline silicon and the silicon dioxide on the sidewalls is then etched back to define the column lines in the bottom of the trenches. A gate oxide layer is thermally grown on the sides of the trenches. A layer of polycrystalline silicon is then deposited on the surface of the gate oxide layer using chemical vapor deposition which provides a conformal polycrystalline silicon layer. This layer is anisotropically etched to provide polycrystalline sidewalls on the sides of the trenches. An interlevel dielectric is then grown or conformally deposited on the surface of the silicon substrate. A polycrystalline silicon layer which will form the row lines of the EPROM is then deposited on the surface of the substrate. A mask which defines the row lines is then formed on the surface of this polycrystalline silicon layer. The polycrystalline silicon layer is then etched to remove the areas between the formed row lines and further etches are performed to remove the interlevel dielectric and floating gate polycrystalline silicon between the EPROM cells.

Thus vertical floating gate field effect transistors are fabricated on either side of a trench, column lines are formed between and in the bottom of the trenches, and row lines are formed perpendicular to the trenches.

DETAILED DESCRIPTION

Figure 2A:
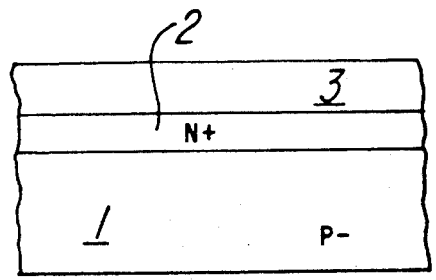
FIGS. 2A–2G are side view schematic diagrams depicting the processing steps necessary to form one embodiment of the present invention.

FIGS. 2A–2G are side view schematic diagrams depicting the processing steps necessary to form one embodiment of the present invention. In FIG. 2A doped layer 2 is formed using techniques well known in the art in substrate 1. Thick silicon dioxide layer 3 is then formed using chemical vapor deposition on the surfaces of doped layer 2. A photoresist layer (not shown) which defines trenches running the length of the array is then formed and patterned on the surface of silicon dioxide layer 3. This pattern is used to etch trenches in silicon dioxide layer 3.

Figure 2B:
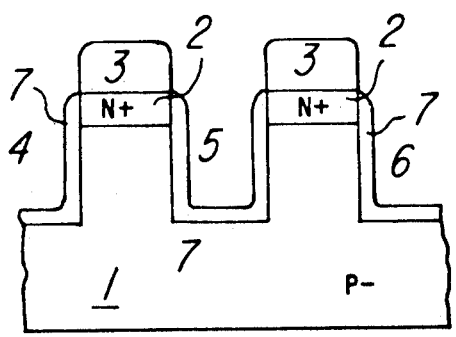

Substrate 1 is then etched using an anisotropic etching process which selectively etches crystalline silicon but does not etch silicon dioxide regions 3 in order to form trenches 4, 5 and 6 of FIG. 2B. Silicon dioxide layer 7 is then thermally grown on the sides of trenches 4, 5 and 6 to a thickness sufficient to block subsequent diffusion of N type dopant. A thickness of approximately 2000 angstroms is usually sufficient. This provides the structure shown in FIG. 2B. The structure of FIG. 2B is then anisotropically etched to remove the portions of silicon dioxide layer 7 in the bottom of trenches 4, 5 and 6 and is then further anisotropically etched to extend trenches 4, 5 and 6 further into substrate 1. This second etch defines the cross-sectional area of the column lines which will be formed in the bottoms of trenches 4, 5 and 6.

Figure 2C:
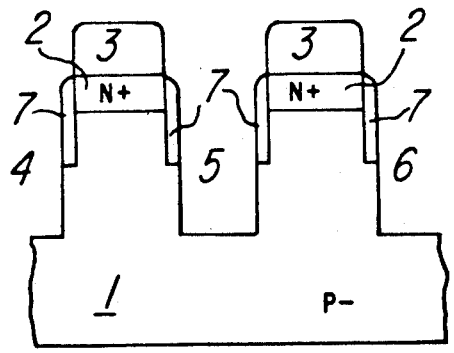
Figure 2D:
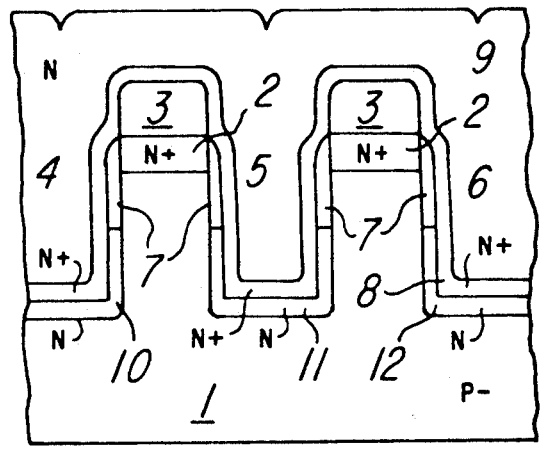

A layer of polycrystalline silicon 8 is then deposited on the surface of the structure of FIG. 2C. Polycrystalline silicon layer 8 is doped to the maximum doping level possible for polycrystalline silicon using dopant co-deposition or phosphorous oxychloride doping. Polycrystalline silicon layer 9 is then deposited to entirely fill trenches 4, 5 and 6 to form the structure shown in FIG. 2D. During further processing, dopant atoms diffuse from polycrystalline silicon layer 8 into polysilicon layer 9 and substrate 1 to form diffused regions 10, 11 and 12 as shown in FIG. 2D. Thus, polycrystalline silicon layers 8 and 9 become indistinguishable.

Figure 2E:
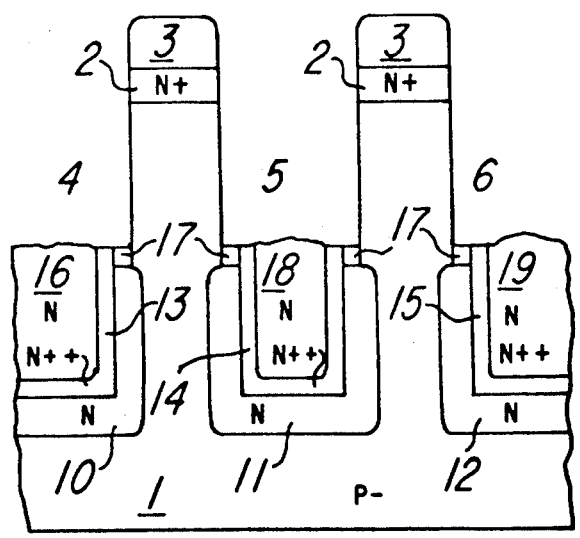

Polycrystalline layers 8 and 9 are then etched back into trenches 4, 5 and 6 to provide column lines 16, 18 and 19 as shown in FIG. 2E. Silicon dioxide layers 7 are etched back to provide spacer regions 17 as shown in FIG. 2E.

Figure 2F:
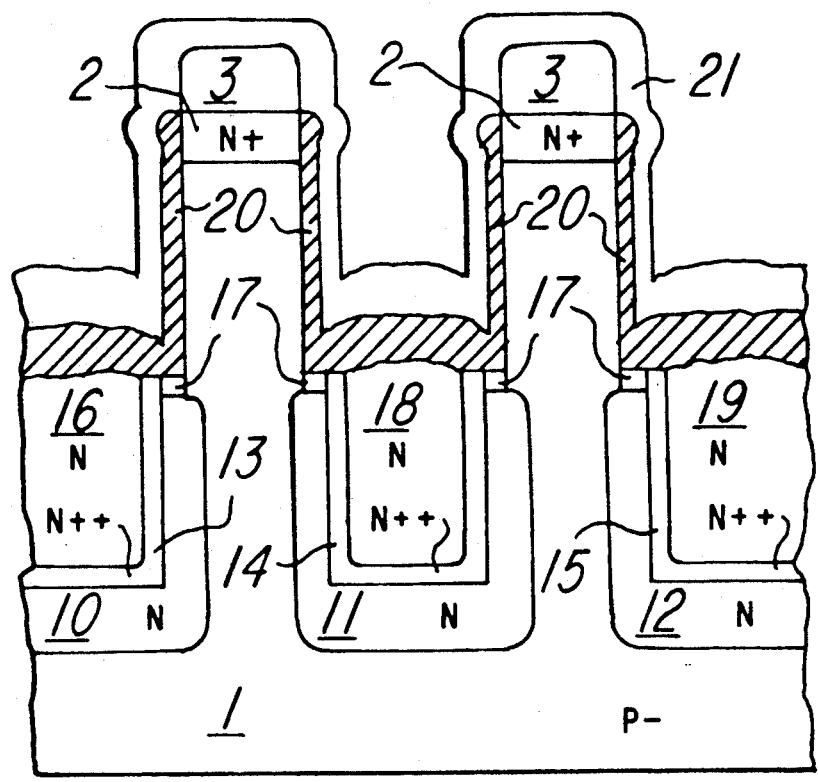
Figure 2G:
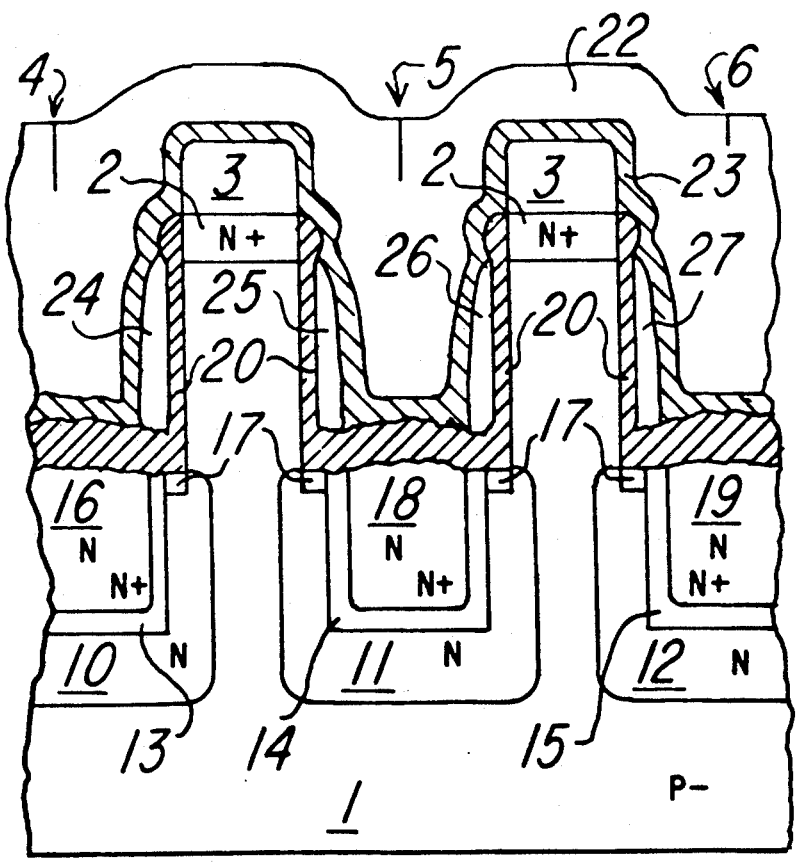

In the preferred embodiment, the structure of FIG. 2E is then subjected to an oxidizing process which provides a thicker oxide layer from polycrystalline silicon and from heavily doped layer 2 than that formed from crystalline silicon, such as thermal oxidation in a steam ambient, at approximately 850 degrees centigrade, for approximately 10 minutes. This provides silicon dioxide layers 20 as shown in FIG. 2F. Polycrystalline silicon layer 21 is then deposited using chemical vapor deposition. Polycrystalline silicon layer 21 is then anisotropically etched to provide floating gate lines 24, 25, 26 and 27 as shown in FIG. 2G. The thicker portions of silicon dioxide layer 20 above protect column lines 16, 18 and 19 from this etch. Interlevel insulator layer 23 is then formed using techniques well known in the art. A preferred technique for forming interlevel insulator layer 23 is chemical vapor deposition of a layer of silicon dioxide approximately 250 angstroms thick followed by a layer of silicon nitride deposited by chemical vapor deposition which is also approximately 250 angstroms thick.

Figure 1:
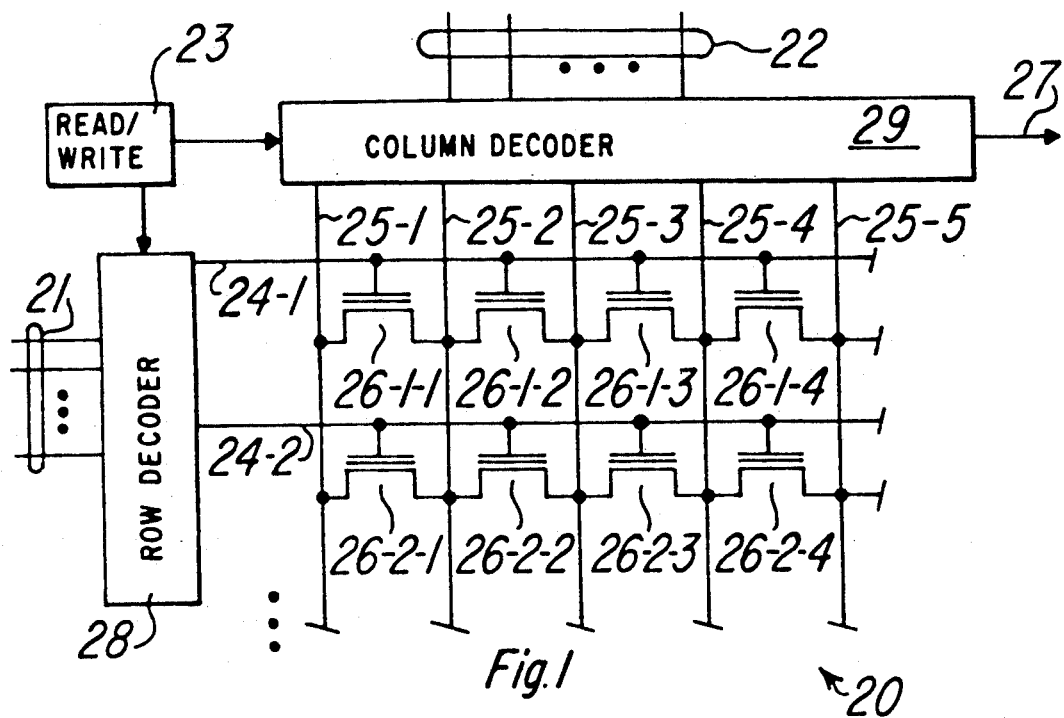
FIG. 1 is a schematic diagram of an EPROM.
Figure 3:
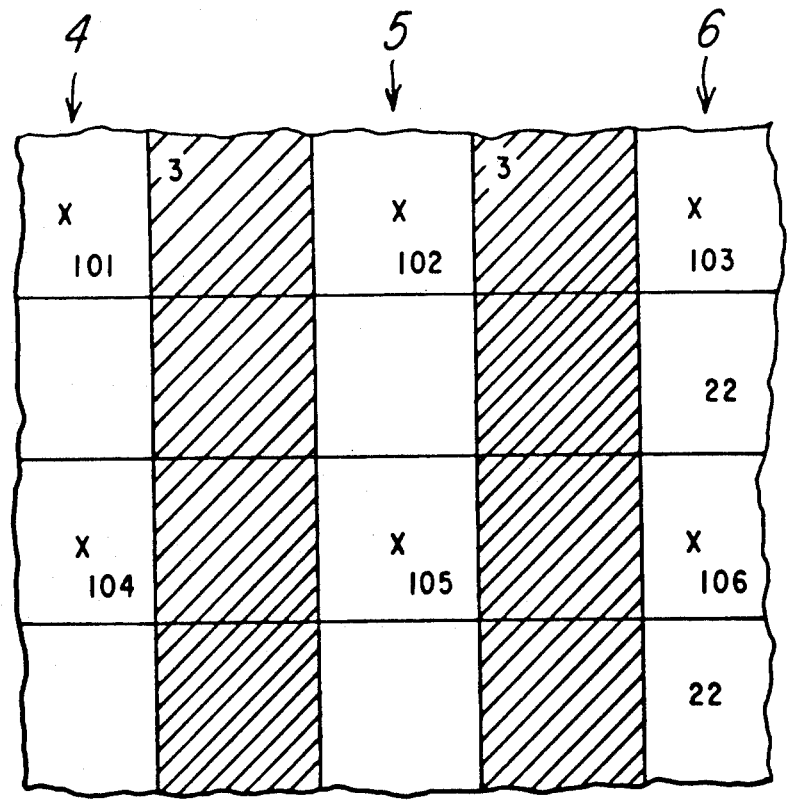
FIG. 3 is a plan-view diagram indicating those areas of the EPROM which are etched to define the edges of the floating gates.

Polycrystalline silicon layer 22 is then deposited to provide the structure shown in FIG. 2G. Polycrystalline silicon layer 22 is then patterned and etched to provide row lines running horizontal to the page. FIG. 3 is a partial-plan view of the EPROM array of this invention. Insulator regions 3 run perpendicular to the page in FIG. 2G. Row lines 22 run horizontally to the plane of the page in FIG. 2G. Etching regions 101, 102, 103, 104, 105, and 106 are not protected by a photoresist mask formed on the surface of polycrystalline silicon row lines 22 nor by thick protective oxide regions 3. Etching regions 101–106 are then etched by: first completely etching polycrystalline layer 22 from etching regions 101–106; then, using a brief silicon nitride etch, removing the silicon nitride layer of interlevel dielectric 23; and then, using a brief silicon dioxide etch, removing the oxide layer of interlevel oxide region 23. A second polycrystalline silicon etch is then performed to remove the portion of floating gates 24, 25, 26 and 27 in etching regions 101–106. This polycrystalline etching step defines separate floating gate regions for each EPROM cell in the array of this embodiment of the invention.

A protective silicon dioxide layer (not shown) is then formed over the entire surface of the structure of FIG. 3. Openings are then etched to contact column lines 16, 18 and 19, and source/drain diffusions 2 using techniques well known in the art. Thus an EPROM array is formed having a control gate comprising row lines 22, floating gates, such as floating gates 24, 25, 26 and 27, and source/drain regions 10, 11, 12 and 2. Floating gates 24, 25, 26 and 27 are charged by injecting hot electrons through silicon dioxide layer 20 from substrate 1.

TECHNICAL ADVANTAGES

An EPROM constructed according to the teachings of this invention provides a nonvolatile memory circuit of far greater density than those achievable by techniques known in the art. A floating gate field effect transistor cell is formed on the sidewall of a trench requiring no planar surface area. Thus an array occupying a very small surface area may be fabricated. However, present techniques limit the size of row and column decoders and thus set a minimum array size. In this case, the technique of this invention allows the fabrication of an array with very wide row and column lines. This lowers the resistance of the row and column lines, thus reducing the RC time constant of the array and providing a faster memory.

I claim:

1. A process for forming an array of floating gate field effect transistors comprising the steps of:

providing a substrate;

forming a plurality of elongated, parallel trenches in said substrate;

forming a plurality of first source/drains in said substrate near the bottom of each said trench, all of the first source/drains near the bottom of a single one of said trenches being connected together but isolated from all of said first source/drains near the bottom of others of said trenches;

forming a plurality of second source/drains in said substrate at the mouth of said trenches thus defining a plurality of channel regions in said substrate, each channel region located between one of said first source/drains and one of said second source/drains;

forming a plurality of floating gates in each of said trenches, each floating gate vertically disposed on a sidewall of one of said trenches adjacent to and insulated from a respective one of said channel regions;

forming a plurality of control gates in each of said trenches, each of said control gates on the surface of and insulated from one of said floating gates in each of said trenches.

2. The process of claim 1, in which said step of forming a plurality of floating gates includes differentially oxidizing to form a greater oxide thickness on said source/drain regions than on other portions of said trench, depositing a layer of floating gate material on said substrate, and anisotropically etching said layer of floating gate material.

3. A process for forming an array of floating gate field effect transistors in a substrate comprising the steps of:

forming a plurality of elongated, parallel trenches in said substrate;

forming a plurality of first source/drains in said substrate near the bottom of each said trench, all of the first source/drains near the bottom of a single one of said trenches being connected together but isolated from all of said first source/drains near the bottom of others of said trenches;

forming a plurality of second source/drains in said substrate at the mouth of said trenches thus defining a plurality of first channel regions in said substrate, each first channel region located between one of said first source/drains and one of said second source/drains regions;

forming a plurality of third source/drains in said substrate at the mouth of said trenches on the opposite side of said trenches from said plurality of second source/drains thus defining a plurality of second channel regions in said substrate, each second channel region located between one of said first source/drains and one of third source/drains;

forming a plurality of first floating gates in each of said trenches, each first floating gate vertically disposed on the side of one of said trenches adjacent to and insulated from a respective one of said first channel regions;

forming a plurality of second floating gates in each of said trenches, each second floating gate vertically disposed on the side of one of said trenches adjacent to and insulated from a respective one of said second channel regions;

forming a plurality of control gates in each of said trenches, each of said control gates on the surface of and insulated from one of said first and second floating gates in each of said trenches.

4. A process for forming an array of floating gate field effect transistors in a substrate comprising the steps of:

forming a first conductive layer on the substrate;

forming a plurality of elongated, parallel trenches extending through said first conductive layer and into said substrate to define a plurality of first conductive column lines at the mouths of said trenches, adjacent ones of said first conductive column lines spaced apart by one of said trenches, each first conductive column line having a plurality of first source/drain regions;

forming a second conductive column line in the bottom of each of said trenches, each second conductive column line having a plurality of second source/drain regions, each floating gate field effect transistor including a first source/drain region and a second source/drain region separated by a substantially vertical channel region;

forming a plurality of floating gates in said trenches, each floating gate vertically disposed on a sidewall of one of said trenches adjacent to and insulate form a respective one of said channel regions;

forming row lines at an angle to said column lines, said row lines including control gates in said trenches insulated from said floating gates.

5. The process of claim 4 in which the step of forming floating gates includes:

forming a first insulator layer in each of said trenches;

forming a second conductive layer over said first insulator layers;

anisotropically etching said second conductive layer to define a pair of floating gate lines on opposing sidewalls of each of said trenches;

etching said floating gate lines to define a plurality of pairs of floating gates on opposing sidewalls of said trenches.

6. The process of claim 5 in which the step of forming row lines includes:

forming a second insulator layer over said substrate;

forming a third conductive layer over said second insulator layer;

etching said third conductive layer to define said plurality of row lines at an angle to said column lines.

7. A method for forming a pair of memory cells in a substrate of a first conductivity type, comprising the steps of:

forming a doped layer in said substrate, said doped layer being of a second conductivity type opposite said first conductivity type;

forming a first insulator layer over said doped layer;

forming a first trench extending through said first insulator layer and said doped layer and into said substrate to a first depth, said first trench having sidewalls and a bottom;

forming a second insulator layer over said doped layer and said substrate on the sidewalls of said first trench;

extending said first trench into said substrate to a second depth;

filling said first trench with material of said second conductivity type;

removing a portion of said material of saidd second conductivity type filling said first trench and a portion of said second insulator layer to form a second trench having sidewalls and a bottom, the sidewalls of said second trench including exposed portions of said doped layer and said substrate;

forming a third insulator layer over the sidewalls and bottom of said second trench;

forming a conductive layer over said third insulator layer; and anisotropically etching said conductive layer to define two floating gates on opposing sides of said trench.

8. The method of claim 7, in which said step of filling said trench includes;

forming a first layer of said second conductivity type on the sidewalls and bottom of said first trench, said first layer being highly doped;

forming a second layer of said second conductivity type over said substrate to fill said first trench.

* * * * *